United States Patent
Huang et al.

[19]

[11] Patent Number: 6,051,984
[45] Date of Patent: Apr. 18, 2000

[54] WAFER-LEVEL METHOD OF HOT-CARRIER RELIABILITY TEST FOR SEMICONDUCTOR WAFERS

[75] Inventors: Honda Huang, Changhua; Jiuun-Jer Yang, Hsingtien, both of Taiwan

[73] Assignee: Winbond Electronics Corp., Hsinchu, Taiwan

[21] Appl. No.: 08/964,372

[22] Filed: Nov. 6, 1997

[30] Foreign Application Priority Data

Feb. 20, 1997 [TW] Taiwan ................................. 86101996

[51] Int. Cl.[7] .................................................. H01L 21/00
[52] U.S. Cl. .......................... 324/765; 324/768; 324/769; 363/59
[58] Field of Search ..................................... 324/765, 769, 324/768, 764, 527; 363/59, 60

[56] References Cited

U.S. PATENT DOCUMENTS

| | | | |
|---|---|---|---|
| 5,426,375 | 6/1995 | Roy et al. ................................. | 324/769 |
| 5,598,009 | 1/1997 | Bui ............................................ | 257/48 |

Primary Examiner—Josie Ballato
Assistant Examiner—Minh Tang
Attorney, Agent, or Firm—J. C. Patents; Jiawei Huang

[57] ABSTRACT

A wafer-level method is provided for hot-carrier reliability testing a plurality of MOS transistors formed in a semiconductor wafer. The MOS transistors in the semiconductor wafer are divided into at least three groups, including a first group, a second group, and a third group. A built-in multi-voltage supplier is integrally formed along with the MOS transistors undergoing testing in the same semiconductor wafer. This built-in multi-voltage supplier is devised in such a manner as to divide an input voltage into at least four testing voltages, including a first drain voltage, a second drain voltage, a third drain voltage, and a gate voltage. The gate voltage is connected to all of the MOS transistors undergoing testing, while the first drain voltage is connected to the drain of all of the first group of MOS transistors, the second drain voltage is connected to the drain of all of the second group of MOS transistors, and the third drain voltage is connected to the drain of all of the third group of MOS transistors. After this, the electrical characteristics under influence of the hot-carrier effects are measured. The method allows for a wafer-level testing procedure that can be performed immediately after the fabrication of the semiconductor wafer is completed. The testing procedure is also efficient and cost-effective to perform.

17 Claims, 3 Drawing Sheets

WAFER-LEVEL METHOD OF HOT-CARRIER RELIABILITY TEST FOR SEMICONDUCTOR WAFERS

BACKGROUND OF THE INVENTION

1. Field of the Invention

This invention relates to methods for testing semiconductors, and more particularly, to a method of hot-carrier reliability test for evaluating the lifetime of a plurality of metal-oxide semiconductor (MOS) transistors in a semiconductor wafer under the influence of hot-carrier effects. The method is based on wafer-level rather than package-level, allowing the hot-carrier reliability test to be performed out with increased efficiency and cost-effectiveness.

2. Description of Related Art

A hot-carrier reliability test is a test procedure for evaluating the lifetime of MOS transistors formed in finished products of semiconductor devices under the influence of the hot-carrier effects. One conventional method for hot-carrier reliability test is first to divide the MOS transistors under testing into at least three groups, and then apply different drain voltages to the different groups of the MOS transistors for multi-device stress.

To achieve the multi-device stress, the testing circuit should be devised in such a manner as to be able to supply a total of at least eight testing voltages, including three drain voltages, three gate voltages, one substrate voltage, and one source voltage. This number of the testing voltages is often considered quite laborious to connect to the transistors undergoing the test. The testing procedure is therefore quite time-consuming and costly to perform.

Moreover, the conventional method is takes place at the package-level, which means that the hot-carrier reliability test is conducted after the semiconductor wafer is packaged. In this way, the testing voltages are connected via the output pads on the IC package. One major drawback to the package-level method, however, is that the packaging of the semiconductor wafer usually requires several weeks to complete. Therefore, the hot-carrier reliability test has to wait for several weeks to be performed after the fabrication of the semiconductor wafer is completed. This significantly delays the delivery of the products of the semiconductor devices and thus makes them less competitive in the market.

SUMMARY OF THE INVENTION

It is therefore a primary objective of the present invention to provide a method for hot-carrier reliability test at the wafer-level that allows the hot-carrier reliability test to be performed right after the fabrication of the semiconductor wafer is completed without having to wait for several weeks until the semiconductor wafer is packaged.

It is another objective of the present invention to provide a method for hot-carrier reliability test which allows the testing procedure to be less time-consuming to perform.

It is still another objective of the present invention to provide a method for hot-carrier reliability test which allows the testing procedure to be more efficient and less costly to conduct.

In accordance with the foregoing and other objectives of the present invention, a new method for hot-carrier reliability test used to test the hot-carrier reliability of an array of MOS transistors formed in a semiconductor wafer is provided.

The MOS transistors in the semiconductor wafer are divided into at least three groups, including a first group, a second group, and a third group. A built-in multi-voltage supplier is integrally formed along with the MOS transistors undergoing testing in the same semiconductor wafer.

This built-in multi-voltage supplier is devised in such a manner as to divide an input voltage into at least four testing voltages, including a first drain voltage, a second drain voltage, a third drain voltage, and a gate voltage.

The gate voltage is connected to all of the MOS transistors undergoing testing, while the first drain voltage is connected to the drain of all of the first group of MOS transistors, the second drain voltage is connected to the drain of all of the second group of MOS transistors, and the third drain voltage is connected to the drain of all of the third group of MOS transistors. Under such voltage connections, the hot-carrier reliability of the MOS transistors are tested.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENT

The following preferred embodiment of the invention discloses a method of hot-carrier reliability testing to evaluate the lifetime of a plurality of MOS transistors formed in a semiconductor wafer. In accordance with the invention, a built-in multi-voltage supplier is built as an integral semiconductor structure along with the MOS transistors undergoing testing in the same semiconductor wafer. The MOS transistors in the semiconductor wafer are usually equal in size. For the hot-carrier reliability test, the MOS transistors are divided into at least three groups, and the built-in multi-voltage supplier is devised in such a manner as to be capable of supplying a number of testing voltages that are applied in a predetermined manner to the three groups of MOS transistors. Under the application of these testing voltages the hot-carrier reliability test is conducted to evaluate the lifetime of the MOS transistors. The method of hot-carrier reliability test in accordance with the invention will be described in full detail in the following with reference to FIGS. 1 through 3.

Figure 1:
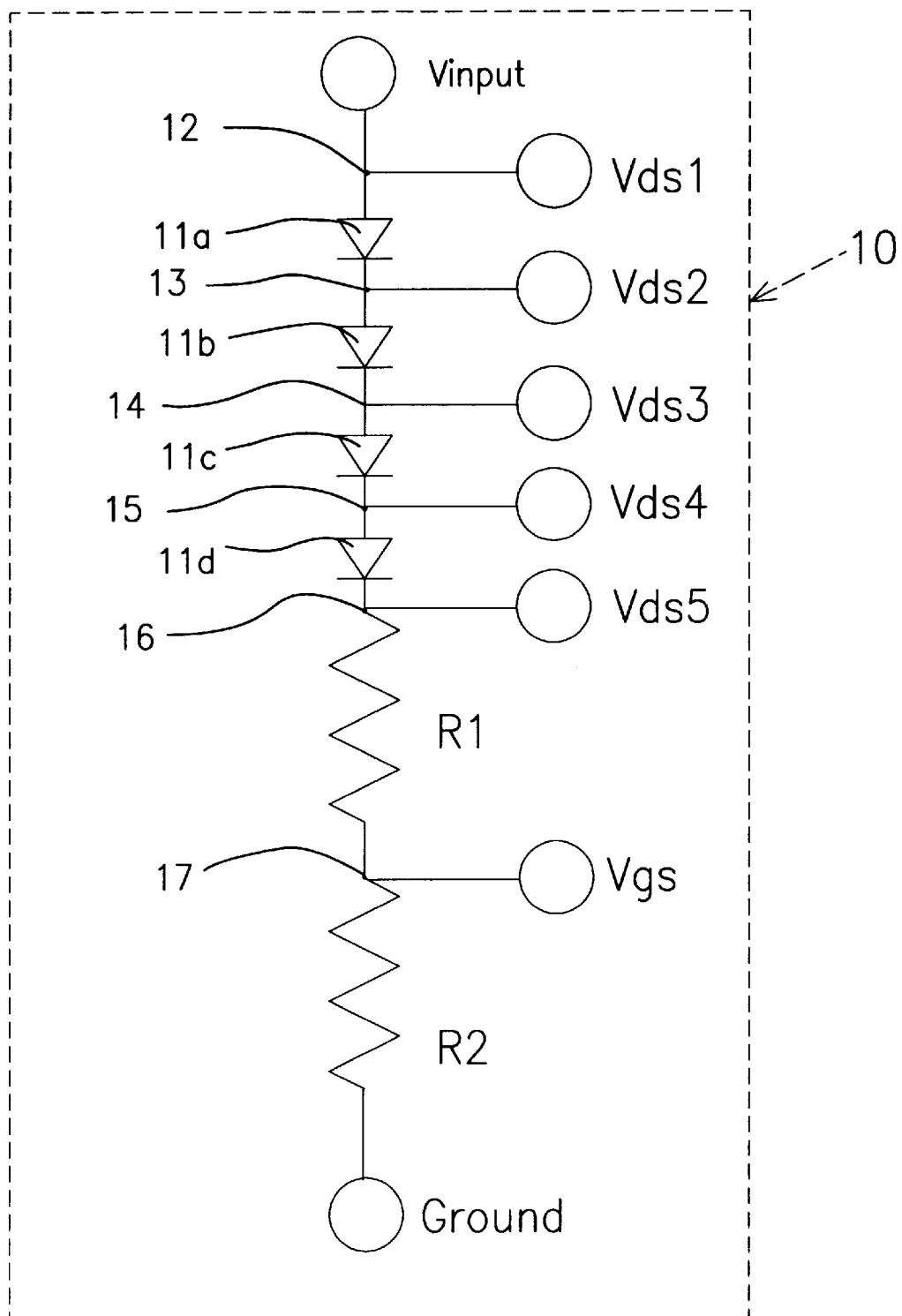
FIG. 1 is a schematic circuit diagram of a built-in multi-voltage supplier used in the method according to the invention for hot-carrier reliability test.

Referring first to FIG. 1, there is shown a schematic circuit diagram of a built-in multi-voltage supplier 10 which is used in the method according to the invention for supplying a number of testing voltages that should be applied to the MOS transistors undergoing testing. This built-in multi-voltage supplier 10 is built as an integral semiconductor structure in the same semiconductor wafer in which the MOS transistors under testing are formed.

As shown, the built-in multi-voltage supplier 10 includes a plurality of serially-connected diodes, for example four as respectively designated by the reference numerals 11a, 11b, 11c, 11d. This allows the built-in multi-voltage supplier 10 to produce five drain voltages $V_{ds1}$, $V_{ds2}$, $V_{ds3}$, $V_{ds4}$, $V_{ds5}$. Fundamentally, the number of the diodes is dependent on the number of testing voltages that are to be produced by the built-in multi-voltage supplier 10. For example, if the built-in multi-voltage supplier 10 includes only two diodes 11a, 11b, it is devised to produce three drain voltages only.

Each of these diodes 11a, 11b, 11c, 11d has a fixed voltage drop thereacross when conducting connect. Typically, the voltage drop is about 0.7 V (volt). These diodes 11a, 11b, 11c, 11d are used together to produce desired number of drain voltages serving as part of the testing voltages.

In the case of FIG. 1, the first diode 11a has a positive end connected to the node 12 and a negative end connected to the node 13; the second diode 11b has a positive end connected to the node 13 and a negative end connected to the node 14; the third diode 11c has a positive end connected to the node 14 and a negative end connected to the node 15; and the fourth diode 11d has a positive end connected to the node 15 and a negative end connected to the node 16. Further, the node 12 is connected to a power source $V_{input}$.

Further, a pair of serially-connected resistors R1, R2 are connected to the node 16. The first resistor R1 has one end connected to the node 16 and the other end connected to the node 17, and the second resistor R2 has one end connected to the node 17 and the other end connected to the ground. The two resistors R1, R2 are equal in resistance value.

The testing circuit of FIG. 1 is devised specifically to provide a plurality of drain voltages $V_{ds1}$, $V_{ds2}$, $V_{ds3}$, $V_{ds4}$, $V_{ds5}$ from the input voltage $V_{input}$. The first drain voltage $V_{ds1}$ is fetched from the node 12; the second drain voltage $V_{ds2}$ is fetched from the node 13; the third drain voltage Vds3 is fetched from the node 14; the fourth drain voltage $V_{ds4}$ is fetched from the node 15; and the fifth drain voltage $V_{ds5}$ is fetched from the node 16. Further, from the node 17, a gate voltage $V_{gs}$ can be fetched. In the case of FIG. 1, the testing circuit is capable of supplying five different drain voltages and one gate voltages serving as testing voltages for use in the hot-carrier reliability test.

In preferred embodiments of the invention, the diodes 11a, 11b, 11c, 11d can be P-N junction diodes based on either $n^+/p$ or $p^+/n$ junctions or Schottky diodes. The resistors R1, R2 can be doping areas on the semiconductor wafer being tested, such as n-well doping areas or p-well doping areas. All of the diodes 11a, 11b, 11c, 11d and resistors R1, R2 can be fabricated in the semiconductor wafer without having to introduce additional processes.

Figure 2:
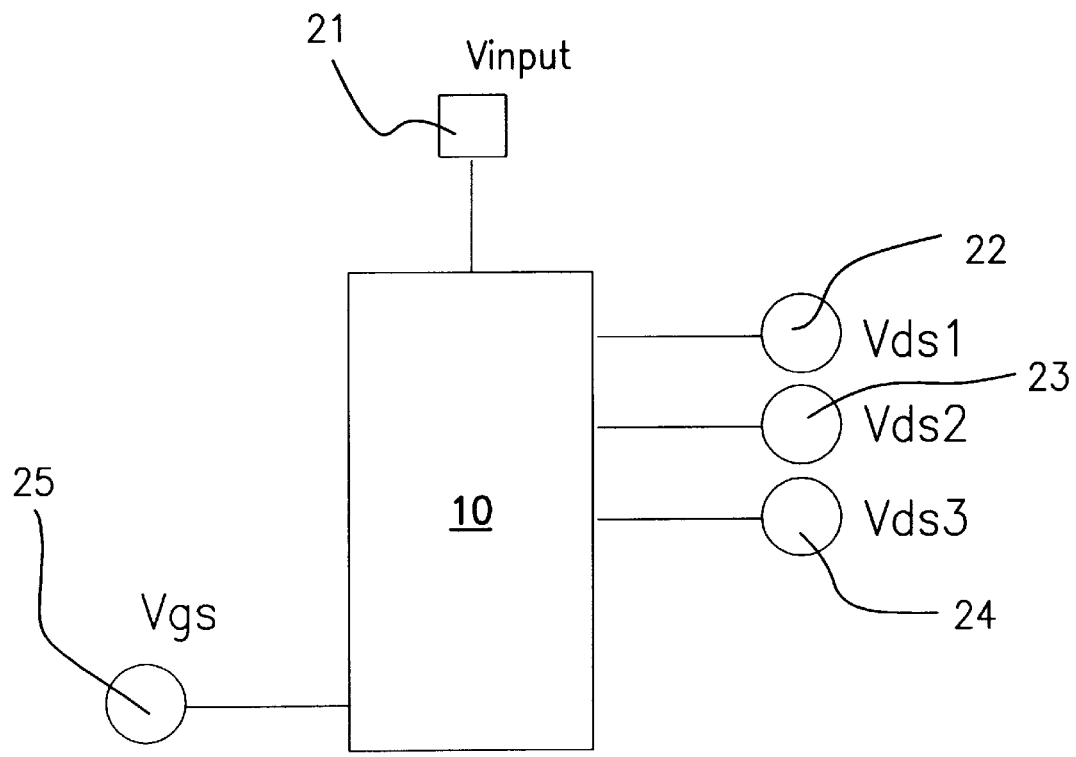
FIG. 2 is a schematic diagram, particularly showing the externally-connected pads for the built-in multi-voltage supplier of FIG. 1.

FIG. 2 is a schematic diagram showing how the built-in multi-voltage supplier 10 of FIG. 1 is externally wired for connection of the input voltage and the produced testing voltages. The built-in multi-voltage supplier 10 is connected via a first pad 21 to receive the input voltage $V_{input}$. In addition, a second pad 22 is used to connect the first drain voltage $V_{ds1}$ to the first group of MOS transistors under testing; a third pad 23 is used to connect the second drain voltage $V_{ds2}$ to the second group of MOS transistors under testing; and a fourth pad 24 is used to connect the third drain voltage $V_{ds3}$ to the third group of MOS transistors under testing. Further, a fifth pad 25 is used to connect the gate voltage $V_{gs}$.

Figure 3:
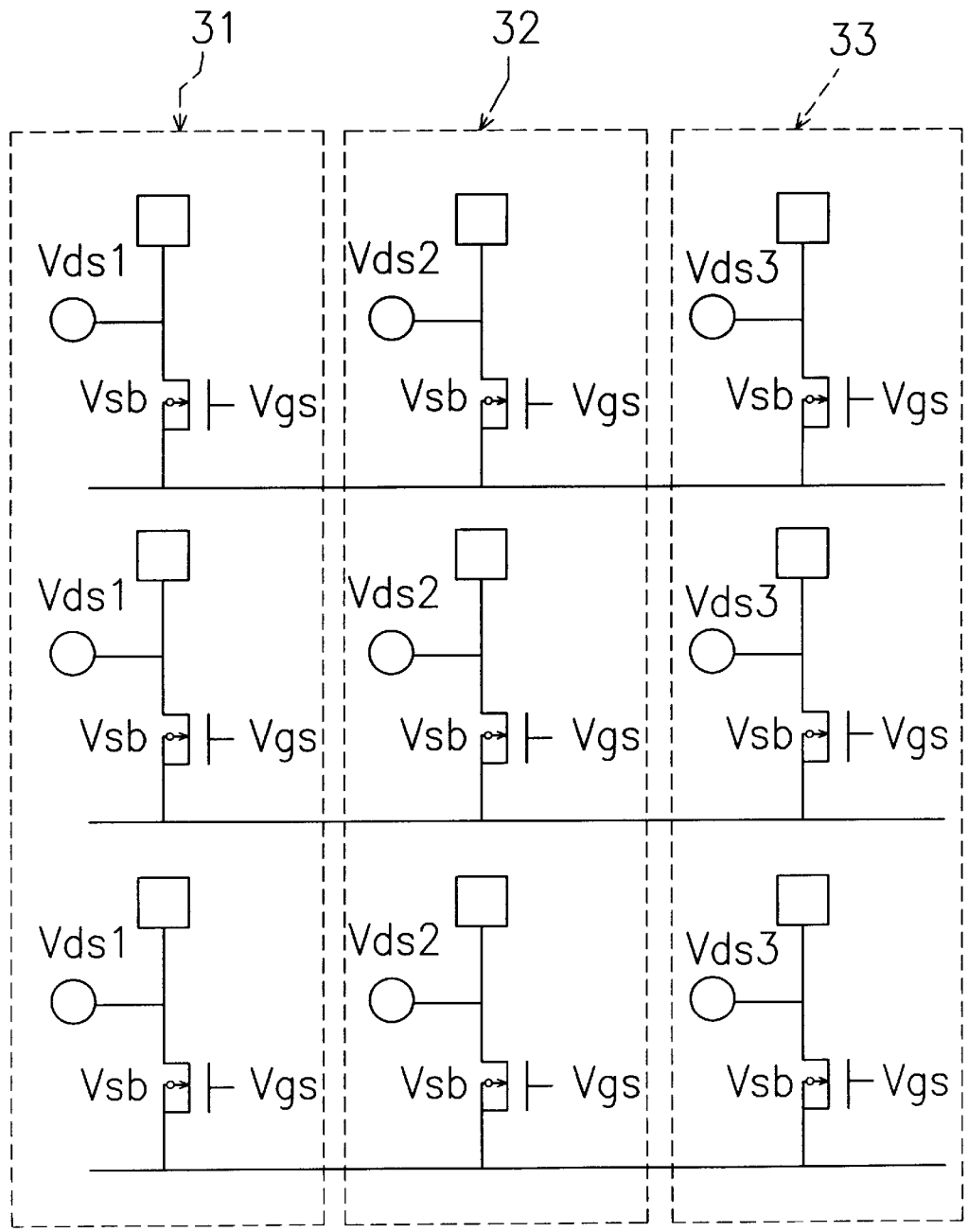
FIG. 3 is a schematic diagram used to depict how a plurality of MOS transistors are divided into three groups and connected to the testing voltages supplied by the built-in multi-voltage supplier of FIG. 1.

Referring to FIG. 3, there is shown a schematic diagram depicting how the testing voltages $V_{ds1}$, $V_{ds2}$, $V_{ds3}$, and $V_{gs}$ are connected to the MOS transistors undergoing testing. In practice, the built-in multi-voltage supplier and the MOS transistors undergoing testing are built together in a so-called test-key module in the semiconductor wafer. The MOS transistors undergoing testing are divided into three groups, including a first group as those enclosed in the dashed box designated by the reference numeral 31, a second group as those enclosed in the dashed box designated by the reference numeral 32, and a third group as those enclosed in the dashed box designated by the reference numeral 33.

The drain of each of the MOS transistors in the first group 31 is connected to the first drain voltage $V_{ds1}$; the drain of each of the MOS transistors in the second group 32 is connected to the second drain voltage $V_{ds2}$; and the drain of each of the MOS transistors in the third group 33 is connected to the third drain voltage $V_{ds3}$. The gate of each of the MOS transistors is connected to the gate voltage $V_{gs}$.

In practice, a probe card (not shown) and switch matrix (not shown) can be used to connect between the built-in multi-voltage supplier 10 and the MOS transistors undergoing testing. When the application of the stress is completed, the switches in the switch matrix are turned off. Then the same switch matrix is used to connect the MOS transistors under testing one by one to a test instrument to test the performance characteristics of the MOS transistors. This procedure is a conventional step so that description thereof will not be further detailed.

In the hot-carrier reliability test, the drain voltages $V_{ds1}$, $V_{ds2}$, $V_{ds3}$, which are at different levels, are applied respectively to the drain of each group of the MOS transistors undergoing testing, and the gate voltage $V_{gs}$ is applied to the gate of all of the MOS transistors undergoing testing. Besides, a voltage $V_{sb}$ is applied to the substrate (not shown) which the semiconductor wafer is based and the source of the MOS transistors.

As described above, the built-in multi-voltage supplier 10 is devised in accordance with the invention to be able to supply a total of four testing voltages including three drain voltages $V_{ds1}$, $V_{ds2}$, $V_{ds3}$ and one gate voltage $V_{gs}$. In the case of FIG. 1, assume VD1, VD2, and VD3, VD4 are respectively the turn-on voltages of the diodes 11a, 11b, 11c, 11d when they conduct connect. The following relationships can be obtained from fundamental circuit analysis,:

$$V_{ds1} = V_{input} \tag{1}$$

$$V_{ds2} = V_{input} - VD1 \tag{2}$$

$$V_{ds3} = V_{input} - VD1 - VD2 \tag{3}$$

$$V_{ds4} = V_{input} - VD1 - VD2 - VD3 \tag{4}$$

$$V_{ds5} = V_{input} - VD1 - VD2 - VD3 - VD4 \tag{5}$$

and $$V_{gs} = (V_{input} - VD1 - VD2 - VD3 - VD4)/2 \tag{6}$$

Accordingly, assume the built-in multi-voltage supplier 10 includes the two diodes 11a, 11b only, and $V_{input}$=7.5 V, $VD_1$=$VD_2$=0.7V. From Eqs. (1), (2), (3), and (6):

$V_{ds1}$=$V_{input}$=7.5 V $V_{ds2}$=$V_{input}$-$VD_1$=7.5-0.7=6.8 V $V_{ds3}$=$V_{input}$-$VD_1$-$VD_2$=7.5-0.7-0.7=6.1 V and $V_{gs}$=($V_{input}$-$VD_1$$VD_2$)/2=3.05 V From Eqs. (1), (2), (3), and (6), it can be learned that the levels of the drain voltages $V_{ds1}$, $V_{ds2}$, $V_{dS3}$, and the gate voltage $V_{gs}$ can be varied simply by adjusting the level of the input voltage $V_{input}$. This allows for easy adjustment of the testing voltages applied to the MOS transistors simply by adjusting one voltage.

In conclusion, the method of the invention provides several advantages. First, the built-in multi-voltage supplier is formed along with the MOS transistors undergoing testing in the same semiconductor wafer for providing a number of testing voltages required for the hot-carrier reliability test on the MOS transistors. This allows for a wafer-level testing procedure that can be performed immediately the fabrication of the semiconductor wafer is completed.

Second, the method of the invention needs only four external voltages, i.e., $V_{ds1}$, $V_{ds2}$, $V_{ds3}$, $V_{gs}$, to perform a multi-device, multi-voltage hot-carrier reliability test. With this advantage, for instance, a single HP (Hewlett-Packard) testing instrument, such as the HP4155, can be used to perform the testing procedure. The hot-carrier reliability test is therefore easy to perform.

Third, the integration of the built-in multi-voltage supplier in the same semiconductor wafer can be accomplished by ordinary IC fabrication processes. No additional special processes are required to fabricate the built-in multi-voltage supplier in the semiconductor wafer. In summary, the method of the invention provides a highly efficient and cost-effective means for performing the hot-carrier reliability test.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of hot-carrier reliability testing on a plurality of MOS transistors formed on a substrate of a semiconductor wafer, comprising the steps of:

forming a built-in multi-voltage supplier in the semiconductor wafer, the built-in multi-voltage supplier being capable of supplying al least four testing voltages including at least one gate voltage and at least a first drain voltage, a second drain voltage, and a third drain voltage;

dividing the MOS transistors undergoing testing into at least three groups, wherein the at least three groups include a first group of MOS transistors, a second group of MOS transistors, and a third group of MOS transistors; connecting the gate voltage to at least one gate of all of the MOS transistors under testing, wherein the MOS transistors are all the same;

connecting the first drain voltage to at least one drain of all of the first group of MOS transistors under testing;

connecting the second drain voltage to at least one drain of all of the second group of MOS transistors under testing;

connecting the third drain voltage to at least one drain of all of the third group of MOS transistors under testing; and measuring the electrical characteristics of the MOS transistors undergoing testing based on the application of the gate voltage, the first drain voltage, the second drain voltage, and the third drain voltage thereto.

2. A method of hot-carrier reliability testing on a plurality of MOS transistors formed on a substrate of a semiconductor wafer, comprising the steps of:

forming a built-in multi-voltage supplier in the semiconductor wafer, the built-in multi-voltage supplier being capable of supplying al least four testing voltages including at least one gate voltage and at least a first drain voltage, a second drain voltage, and a third drain voltage;

dividing the MOS transistors undergoing testing into at least three groups, wherein the at least three groups include a first group of MOS transistors, a second group of MOS transistors, and a third group of MOS transistors;

connecting the gate voltage to at least one gate of all of the MOS transistors under testing;

connecting the first drain voltage to at least one drain of all of the first group of MOS transistors under testing;

connecting the second drain voltage to at least one drain of all of the second group of MOS transistors under testing;

connecting the third drain voltage to at least one drain of all of the third group of MOS transistors under testing;

measuring the electrical characteristics of the MOS transistors undergoing testing based on the application of the gate voltage, the first drain voltage, the second drain voltage, and the third drain voltage thereto; and applying a voltage to the substrate of the semiconductor wafer on which the MOS transistors undergoing testing are formed.

3. The method of claim 2, wherein the first drain voltage, the second drain voltage, and the third drain voltage are unequal in magnitude.

4. The method of claim 2, wherein the built-in multi-voltage supplier includes:

a power source;

a plurality of serially-connected diodes including at least a first diode and a second diode, said first diode having a positive end connected to said power source and a negative end connected to a first node, and said second diode having a positive end connected to said first node and a negative end connected to a second node;

a plurality of resistors including at least a first resistor and a second resistor, the first resistor having a first end connected to the second node and a second end connected to a third node, and said second resistor having a first end connected to the third node and a second end connected to the ground;

the first drain voltage being fetched from said power source;

the second drain voltage being fetched from said first node;

the third drain voltage being fetched from said second node; and the gate voltage being fetched from said third node.

5. The method of claim 4, wherein said built-in multi-voltage supplier is integrally formed in a semiconductor wafer.

6. The method of claim 4, wherein each of said resistors includes a doping area in the semiconductor wafer.

7. The method of claim 4, wherein each of said diodes is a Schottky diode.

8. The method of claim 4, wherein each of said diodes is a Schottky diode.

9. A method of hot-carrier reliability testing on a plurality of MOS transistors formed on a substrate of a semiconductor wafer, comprising the steps of:

forming a built-in multi-voltage supplier in the semiconductor wafer, the built-in multi-voltage supplier being capable of supplying al least four testing voltages including at least one gate voltage and at least a first drain voltage, a second drain voltage, and a third drain voltage;

dividing the MOS transistors undergoing testing into at least three groups, wherein the at least three groups include a first group of MOS transistors, a second group of MOS transistors, and a third group of MOS transistors;

connecting the gate voltage to at least one gate of all of the MOS transistors under testing;

connecting the first drain voltage to at least one drain of all of the first group of MOS transistors under testing;

connecting the second drain voltage to at least one drain of all of the second group of MOS transistors under testing;

connecting the third drain voltage to at least one drain of all of the third group of MOS transistors under testing;

measuring the electrical characteristics of the MOS transistors undergoing testing based on the application of the gate voltage, the first drain voltage, the second drain voltage, and the third drain voltage thereto; and applying a voltage to at least one source of all of the MOS transistors undergoing testing.

10. A structure of hot-carrier reliability testing on a plurality of MOS transistors formed on a substrate of a semiconductor wafer, comprising:

a built-in multi-voltage supplier in the semiconductor wafer, the built-in multi-voltage supplier being capable of supplying al least four testing voltages including at least one gate voltage and at least a first drain voltage, a second drain voltage, and a third drain voltage;

at least three groups of MOS transistors under testing, wherein the MOS transistors are all the same, the at least three groups include a first group of MOS transistors, a second group of MOS transistors, and a third group of MOS transistors, the gates of the MOS transistors electrically connecting the gate voltage, at least one drain of all of the first group of MOS transistors electrically connecting the first drain voltage, at least one drain of all of the second group of MOS transistors electrically connecting the second drain voltage, at least one drain of all of the third group of MOS transistors electrically connecting the third drain voltage.

11. A structure of hot-carrier reliability testing on a plurality of MOS transistors formed on a substrate of a semiconductor wafer, comprising:

a built-in multi-voltage supplier in the semiconductor wafer, the built-in multi-voltage supplier being capable of supplying al least four testing voltages including at least one gate voltage and at least a first drain voltage, a second drain voltage, and a third drain voltage;

at least three groups of MOS transistors under testing, wherein the at least three groups include a first group of MOS transistors, a second group of MOS transistors, and a third group of MOS transistors, the gates of the MOS transistors electrically connecting the gate voltage, at least one drain of all of the first group of MOS transistors electrically connecting the first drain voltage, at least one drain of all of the second group of MOS transistors electrically connecting the second drain voltage, at least one drain of all of the third group of MOS transistors electrically connecting the third drain voltage; and the substrate of the semiconductor wafer on which the MOS transistors undergoing testing are formed electrically connecting a voltage.

12. The structure of claim 11, wherein the built-in multi-voltage supplier includes:

a power source;

a plurality of serially-connected diodes including at least a first diode and a second diode, said first diode having a positive end connected to said power source and a negative end connected to a first node, and said second diode having a positive end connected to said first node and a negative end connected to a second node;

a plurality of resistors including at least a first resistor and a second resistor, the first resistor having a first end connected to the second node and a second end connected to a third node, and said second resistor having a first end connected to the third node and a second end connected to the ground;

the first drain voltage being fetched from said power source;

the second drain voltage being fetched from said first node;

the third drain voltage being fetched from said second node; and the gate voltage being fetched from said third node.

13. The structure of claim 12, wherein said built-in multi-voltage supplier is integrally formed in a semiconductor wafer.

14. The structure of claim 12, wherein each of said resistors includes a doping area in the semiconductor wafer.

15. The structure of claim 12, wherein each of said diodes is a P-N junction diode.

16. The structure of claim 12, wherein each of said diodes is a Schottky diode.

17. A structure of hot-carrier reliability testing on a plurality of MOS transistors formed on a substrate of a semiconductor wafer, comprising:

a built-in multi-voltage supplier in the semiconductor wafer, the built-in multi-voltage supplier being capable of supplying al least four testing voltages including at least one gate voltage and at least a first drain voltage, a second drain voltage, and a third drain voltage;

at least three groups of MOS transistors under testing, wherein the at least three groups include a first group of MOS transistors, a second group of MOS transistors, and a third group of MOS transistors, the gates of the MOS transistors electrically connecting the gate voltage, at least one drain of all of the first group of MOS transistors electrically connecting the first drain voltage, at least one drain of all of the second group of MOS transistors electrically connecting the second drain voltage, at least one drain of all of the third group of MOS transistors electrically connecting the third drain voltage; and at least one source of all of the MOS transistors undergoing testing electrically connecting a voltage.

* * * * *